United States Patent
Yang et al.

(10) Patent No.: US 9,321,213 B2
(45) Date of Patent: Apr. 26, 2016

(54) TEMPLATE SYSTEM AND NANO-IMPRINT METHOD USING THE SAME

(71) Applicant: Samsung Electronics Co., Ltd., Suwon-Si, Gyeonggi-Do (KR)

(72) Inventors: Ki-yeon Yang, Seongnam-si (KR); Woong Ko, Hwaseong-si (KR); Jae-kwan Kim, Daejeon (KR); Du-hyun Lee, Suwon-si (KR); Byung-kyu Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 522 days.

(21) Appl. No.: 13/707,690

(22) Filed: Dec. 7, 2012

(65) Prior Publication Data

US 2013/0292865 A1 Nov. 7, 2013

(30) Foreign Application Priority Data

May 3, 2012 (KR) .................. 10-2012-0047126

(51) Int. Cl.
*G03F 7/00* (2006.01)
*B29C 59/02* (2006.01)

(52) U.S. Cl.
CPC ............ *B29C 59/026* (2013.01); *G03F 7/0002* (2013.01)

(58) Field of Classification Search
CPC .................. B29C 59/026; B29C 2033/0005; B29C 2059/023
See application file for complete search history.

(56) References Cited

U.S. PATENT DOCUMENTS

| | | | | |
|---|---|---|---|---|
| 5,129,813 A | * | 7/1992 | Shepherd | 425/504 |
| 7,195,734 B2 | | 3/2007 | Heidari | |
| 7,418,902 B2 | | 9/2008 | Kruijt-Stegeman et al. | |
| 7,691,313 B2 | * | 4/2010 | Choi et al. | 264/299 |
| 8,556,616 B2 | | 10/2013 | Resnick et al. | |
| 2006/0105571 A1 | * | 5/2006 | Colburn et al. | 438/689 |
| 2011/0001254 A1 | | 1/2011 | Kruijt-Stegeman et al. | |

FOREIGN PATENT DOCUMENTS

| | | |
|---|---|---|
| KR | 2009-0017469 | 2/2009 |
| KR | 2011-0046438 A | 5/2011 |

OTHER PUBLICATIONS

Liang, X., et al., Air bubble formation and dissolution in dispensing nanoimprint lithography, Nanotechnology, vol. 18 (2007), pp. 1-7.*
Patel, N. and L.J. Lee, Effects of Fiber Mat Architecture on Void Formation and Removal in Liquid Composite Molding, Polymer Composites, vol. 16, No. 5 (Oct. 1995), pp. 386-399.*

* cited by examiner

*Primary Examiner* — Matthew Daniels
(74) *Attorney, Agent, or Firm* — Harness, Dickey & Pierce, P.L.C.

(57) ABSTRACT

A template system, and a nano-imprint method using the same, include a template having a nano-pattern and configured to transfer the nano-pattern to a resin material on a substrate, and a pressure controlling apparatus configured to change a pressure of the template with respect to the substrate according to an intensity of bubbles captured between the substrate and the template.

11 Claims, 7 Drawing Sheets

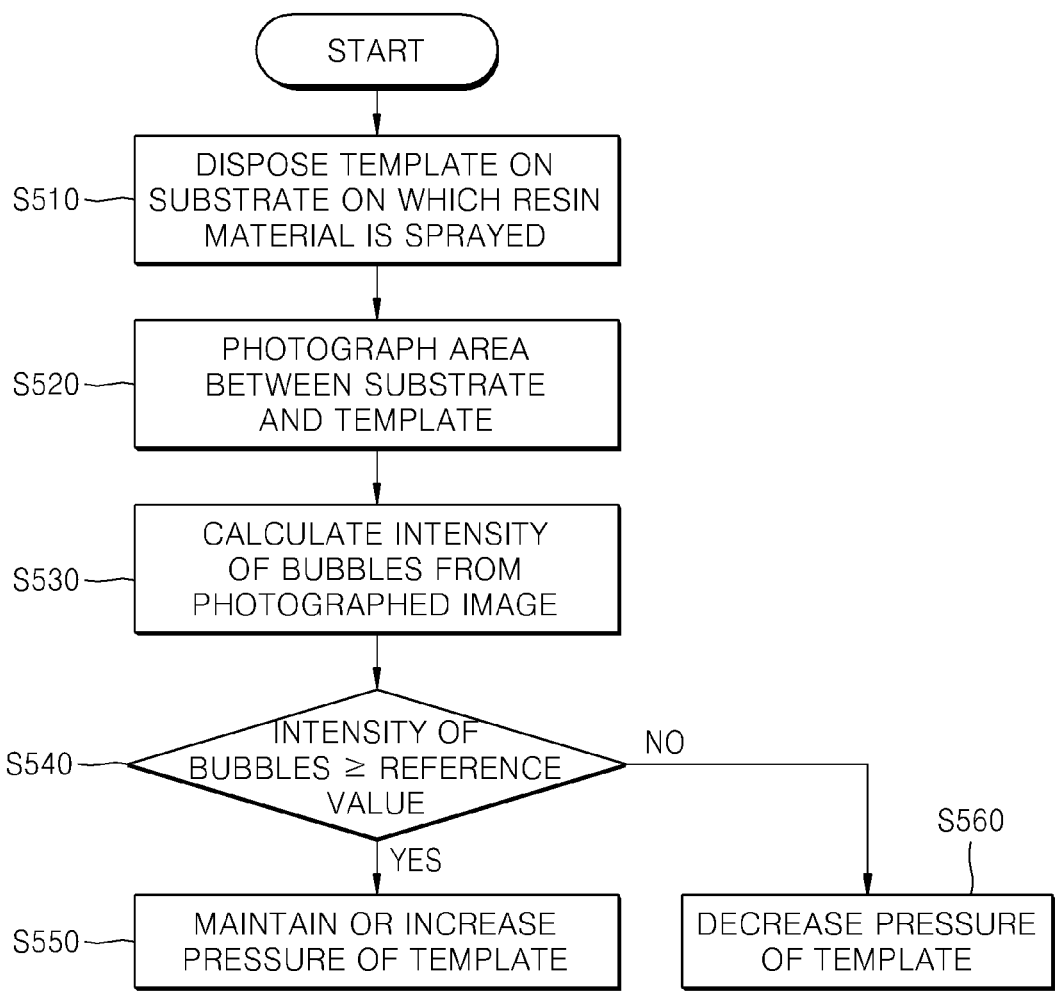

TEMPLATE SYSTEM AND NANO-IMPRINT METHOD USING THE SAME

CROSS-REFERENCE TO RELATED APPLICATIONS

This application claims the benefit of priority under 35 U.S.C. §119 from Korean Patent Application No. 10-2012-0047126, filed on May 3, 2012, in the Korean Intellectual Property Office, the disclosures of which are incorporated herein by reference in its entirety.

BACKGROUND

1. Field

An example embodiment relates to a template system, and another example embodiment relates to a nano-imprint method using the same.

2. Description of the Related Art

A nano-imprint lithography technology refers to a technology that applies pressure to an imprinting resist layer on a substrate by using a template to transfer a nano-pattern formed on a surface of the template to the imprinting resist layer. The nano-imprint lithography technology forms the nano-pattern through a direct contact between the template and the imprinting resist layer and is classified as a thermal nano-imprint lithography technology or an ultra violet (UV) curing nano-imprint lithography technology depending on the type of external energy used when forming patterns.

The UV curing nano-imprint lithography technology is represented by a step and flash imprint lithography (S-FIL) technology. The S-FIL technology is a process of coating a UV-curable liquid imprinting resin on a substrate, applying pressure on the UV-curable liquid imprinting resin by using a transparent template and curing the UV-curable liquid imprinting resin and performs an imprinting process.

Productivity of the S-FIL technology depends on coating of a resin, filling of a resin in a pattern, curing of a resin, and the like. Specifically, during an imprinting process, if bubbles between a substrate and a template are removed by contacting the substrate and the template, an imprinting process speed can be greatly increased. However, because the contacting between the substrate and the template is not smoothly performed occasionally, the bubbles between the substrate and the template are captured (or trapped).

SUMMARY

Provided are a template system capable of improving productivity of a nano-imprint process and a nano-imprint method using the template system.

According to an example embodiment, a template system includes a template having a nano-pattern and configured to transfer the nano-pattern to a resin material on a substrate, and a pressure controlling apparatus configured to change a pressure of the template with respect to the substrate according to an intensity of bubbles captured between the substrate and the template.

The template system may further include a photographing apparatus configured to photograph an area between the substrate and the template, and a bubble calculating apparatus configured to calculate the intensity of the bubbles from an image captured by the photographing apparatus.

The template system may include a template chuck supporting the template. The photographing apparatus, the template chuck, and the template may be sequentially stacked over the substrate.

The pressure controlling apparatus may be configured to maintain or increase the pressure of the template if the intensity of the bubbles is equal to or greater than a reference value.

The pressure controlling apparatus may be configured to decrease the pressure of the template if the intensity of the bubbles is less than the reference value.

The template system may include a template chuck supporting the template, wherein template is coupled to the template chuck to form a cavity.

The pressure controlling apparatus may be configured to change the pressure of the template by adjusting an amount of a medium flowing into the cavity.

A shape of the template may vary according to the pressure of the template.

A surface of the template facing the substrate may expand toward the substrate if the pressure of the template increases.

The template system may include a template chuck supporting the template. The template may include a first plate on which the nano-pattern is formed, and a first supporting unit extending from an edge of the first plate. The first plate may be coupled to the template chuck.

The template chuck may include a second plate facing the first plate such that a cavity is between the first and second plates, and a second supporting unit extending from an edge of the second plate. The second supporting unit may be coupled to the template.

The template system may further include an inlet/outlet connected to the cavity by penetrating an area of the second supporting unit. The inlet/outlet may be configured to allow a medium to flow into/from the cavity.

A shape of the first plate may vary according to an amount of medium injected into the cavity.

According to another example embodiment, a nano-imprint method includes disposing a template having a nano-pattern on a substrate coated with a resin material, and changing a pressure of the template with respect to the substrate according to an intensity of bubbles captured between the substrate and the template.

The nano-imprint method may further include photographing an area between the substrate and the template, and calculating the intensity of the bubbles from a photographic image of the area between the substrate and the template.

The changing of the pressure of the template may include maintaining or increasing the pressure of the template if the intensity of the bubbles is equal to or greater than a reference value.

The changing of the pressure of the template may include decreasing the pressure of the template if the intensity of the bubbles is less than the reference value.

The changing of the pressure of the template may include changing an amount of medium injected into a cavity formed by coupling the template to a template chuck configured to support the template.

The changing of the pressure of the template may result in a change in a shape of the template.

The changing of the pressure of the template may include increasing the pressure of the template such that a surface of the template facing the substrate may expand toward the substrate.

BRIEF DESCRIPTION OF THE DRAWINGS

Example embodiments will be more clearly understood from the following detailed description taken in conjunction with the accompanying drawings. FIGS. 1-6E represent non-limiting, example embodiments as described herein.

FIG. 1 is a schematic view of a template system according to an example embodiment;

FIG. 2 is a cross-sectional view of the template and the template chuck shown in FIG. 1;

FIG. 3 is a plane view of the template and the template chuck shown in FIG. 1;

FIG. 4 is a view showing when the template shown in FIG. 1 expands;

FIG. 5 is a flowchart for describing a process of performing an imprint process while changing pressure according to another example embodiment;

FIGS. 6D to 6E are graphs showing variations in pressure of a template during a nano-imprint process according to a further example embodiment.

DETAILED DESCRIPTION

Figure 1:
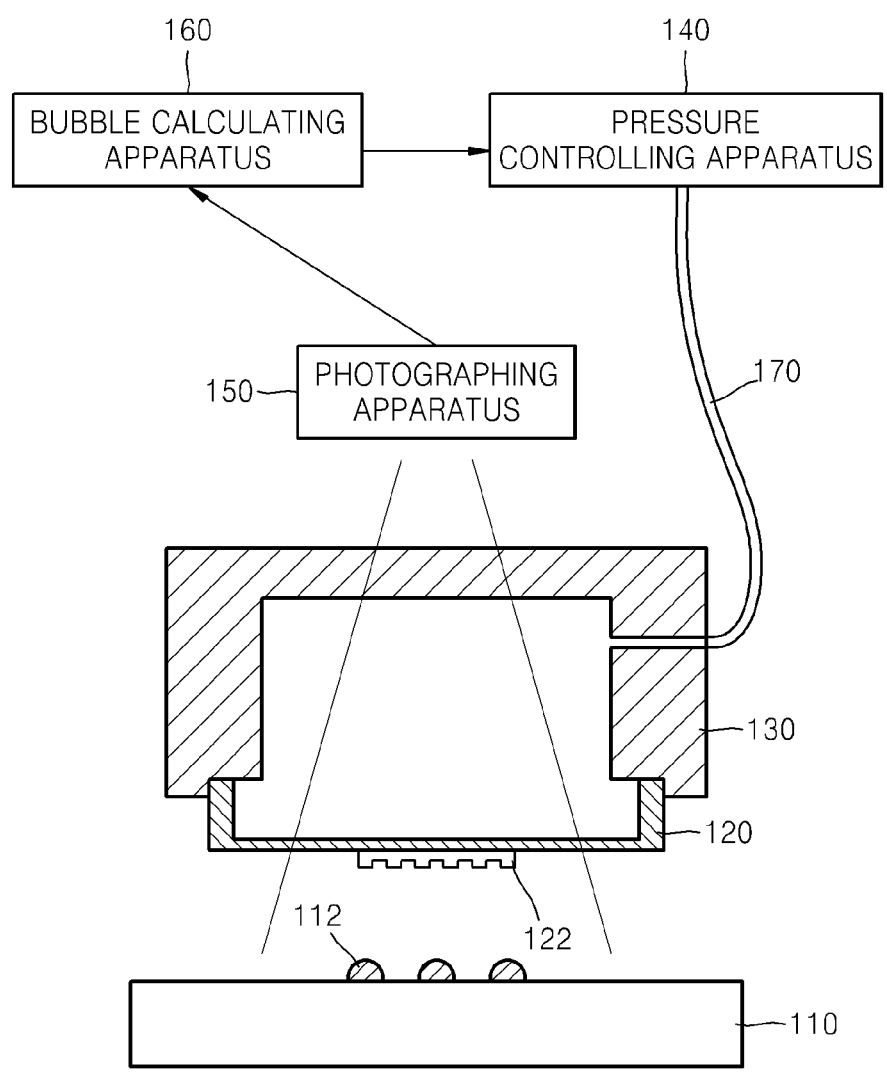

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

As used herein, the term "and/or" includes any and all combinations of one or more of the associated listed items. Expressions such as "at least one of," when preceding a list of elements, modify the entire list of elements and do not modify the individual elements of the list.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An example embodiment relates to a template system, and another example embodiment relates to a nano-imprint method using the same.

FIG. 1 is a schematic view of a template system according to an example embodiment.

Referring to FIG. 1, a template system includes a substrate 110 on which a resin material 112 may be sprayed on a surface of the substrate 110, a template 120 including a nano-pattern 122 that is transferred to the sprayed resin material 112, a template chuck 130 configured to support the template 120, and a pressure controlling apparatus 140 configured to change pressure of the template 120 with respect to the resin material 112 according to an intensity of bubbles captured between the substrate 110 and the template 120. Also, the template system may further include a photographing apparatus 150 configured to photograph an area between the substrate 110 and the template 120 and a bubble calculating apparatus 160 configured to calculate an intensity of bubbles from an image captured by the photographing apparatus 150.

The resin material 112 may be sprayed on the substrate 110. The resin material 112 may be a UV-curable liquid imprinting resin material. The resin material 112 may be sprayed on the substrate 110 in the form of drops.

The template 120 is disposed over the substrate 110 and may include the nano-pattern 122 on a surface facing the substrate 110. The template 120 may have a shape varying according to pressure to be applied.

The template chuck 130 may support the template 120, and may be detachably attached to the template 120. A cavity 136 may be formed between the template 120 and the template chuck 130 due to coupling therebetween. Thus, pressure to be applied to the template 120 may vary according to an amount of fluid injected into the cavity 136. The template chuck 130 and the template 120 will be described later in detail.

The photographing apparatus 150 may be disposed over the template 120 to photograph an area between the substrate 110 and the template 120. In general, the photographing apparatus 150 may be a charge-coupled device (CCD) or complementary metal-oxide semiconductor (CMOS) camera capable of photographing an object. The CCD or CMOS camera is a digital camera that converts an image into an electrical signal by using the CCD or CMOS. The photographing apparatus 150 may photograph the area between the substrate 110 and the template 120 and apply a captured image to the bubble calculating apparatus 160.

The bubble calculating apparatus 160 may calculate an intensity of bubbles from the captured image. The captured image includes an image regarding a resin (i.e., a resin image). Thus, the bubble calculating apparatus 160 sorts a resin image from the captured image and determines whether the resin image includes bubbles. The bubble calculating apparatus 160 may determine whether the resin image includes bubbles having a size equal to or larger than a reference (or, alternatively, predetermined) size. In this regard, the reference (or, alternatively, predetermined) size may be in a range between several and several tens of μm. The bubble calculating apparatus 160 may calculate an intensity of bubbles by dividing the number of bubbles having a reference (or, alternatively, predetermined) size by a size of the resin image, and may apply a calculation result to the pressure controlling apparatus 140.

The pressure controlling apparatus 140 changes pressure of the template 120 with respect to the substrate 110 according to an intensity of bubbles. For example, if the intensity of bubbles is equal to or greater than a reference value, the pressure controlling apparatus 140 may maintain or increase the pressure of the template 120. Also, if the intensity of bubbles is less than the reference value, the pressure controlling apparatus 140 may decrease the pressure of the template 120. In this regard, the reference value refers to a minimum intensity of bubbles which is required to smoothly perform a nano-imprint process and may be determined by a person performing the nano-imprint process. The reference value may vary according to objects of the nano-imprint process.

The pressure controlling apparatus 140 may be configured as a pump including a fluid (or, alternatively, medium) that flows into or out from the template 120. Thus, the fluid may flow into the cavity 136 of the template 120 to increase the pressure of the template 120 or may flow out from the cavity 136 of the template 120 to decrease the pressure of the template 120. Accordingly, the pressure controlling apparatus 140 may be connected to the template 120 and a flow path 170 to allow the fluid to flow into or out from the template 120.

Hereinafter, a structure and an operation of the template will be described.

Figure 2:
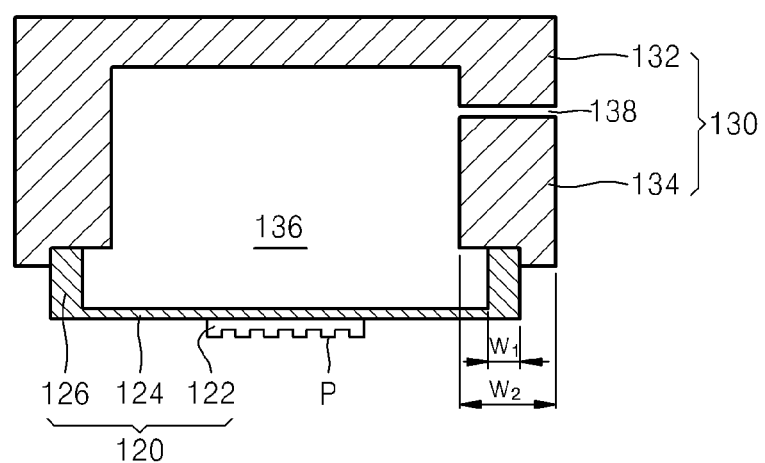
Figure 3:
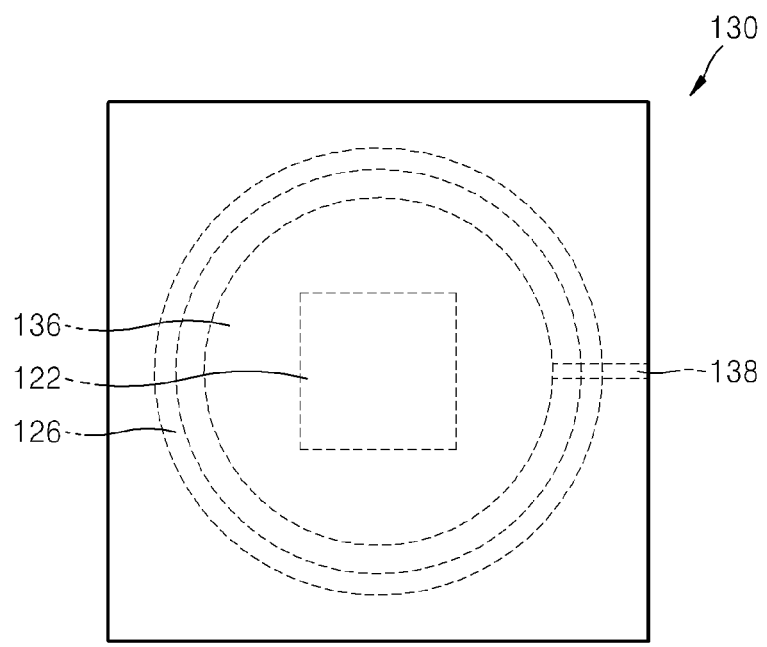

FIG. 2 is a cross-sectional view of the template shown in FIG. 1, and FIG. 3 is a plane view of the template shown in FIG. 1.

As shown in FIGS. 2 and 3, the template 120 includes a first plate 124 on which the nano-pattern 122 is formed and a first supporting unit 126 extending from an edge of the first plate 124 to be coupled to the template chuck 130. The template chuck 130 includes a second plate 132 facing the first plate 124 with the cavity 136 therebetween, and a second supporting unit 134 extending from an edge of the second plate 132 to be coupled to the template 120. The template chuck 130 is connected to the cavity 136 through an area of the second supporting unit 134, and may further include an inlet/outlet 138 via which a medium (e.g., gas or liquid) flows into/from the cavity 136. A width $w_1$ of sidewalls of the first supporting unit 126 may be smaller than a width $w_2$ of sidewalls of the second supporting unit 134. Accordingly, an inner space of the cavity 136 may be increased toward the first plate 124 from the second plate 132.

The template 120 and the template chuck 130 may be manufactured by performing a separate process and may be coupled to each other during the nano-imprint process. The template 120 and the template chuck 130 may be formed of a material having a high transmissivity. For example, the template 120 and the template chuck 130 may be formed of transparent quartz. The first plate 124 of the template 120 may be formed as a thin film. Thus, the shape of the first plate 124 may easily vary according to internal pressure of the cavity 136. In other words, when the internal pressure of the cavity 136 is increased, the first plate 124 easily expands toward the substrate 110, thereby improving a conformal contact characteristic between the first plate 124 and the substrate 110.

The cavity 136 may have various shapes. In a state where a fluid is not flowed into the cavity 136, the first plate 124 on which the nano-pattern 122 is formed may be flat. However, example embodiments are not limited thereto. In the state where a fluid is not flowed into the cavity 136, the first plate 124 may have a convex or concave shape. FIG. 2 shows an example where the first plate 124 is formed flat.

Also, as shown in FIG. 3, a cross-section of the cavity 136 may have a circular shape. However, example embodiments are not limited thereto, and the cross-section of the cavity 136 may have an oval shape or any of various polygonal shapes.

The cavity 136 may be formed in such a way that its whole cross-section has a circular shape as shown in FIG. 3. Alternatively, the cavity 136 may have a square shape, or any of various polygonal shapes.

On the other hand, the nano-pattern 122 may be formed on the first plate 124. The nano-pattern 122 and the first plate 124 may be formed of the same material or different materials. The nano-pattern 122 may include one or more protrusion portions P. The protrusion portions P may be disposed spaced apart from one another. An empty space between the two adjacent protrusion portions P is a recessed portion, and thus the nano-pattern 122 has structure in which the protrusion portion P and the recessed portion are alternately disposed. The protrusion portion P may have a nano-sized width. In other words, a width of the protrusion portion P may be from about several to about several hundreds of nm, for example, from about several to about several tens of nm.

As described above, the nano-pattern 122 may be formed as a concave-convex pattern to have the nano-scaled protrusion portions P, and thus, the template 120 may be used for a nano-imprint process. In other words, if the template 120 having a concave-convex pattern is used with the nano-pattern 122 that has the nano-scaled protrusion portions P, a nano-imprint pattern may be formed.

Figure 4:
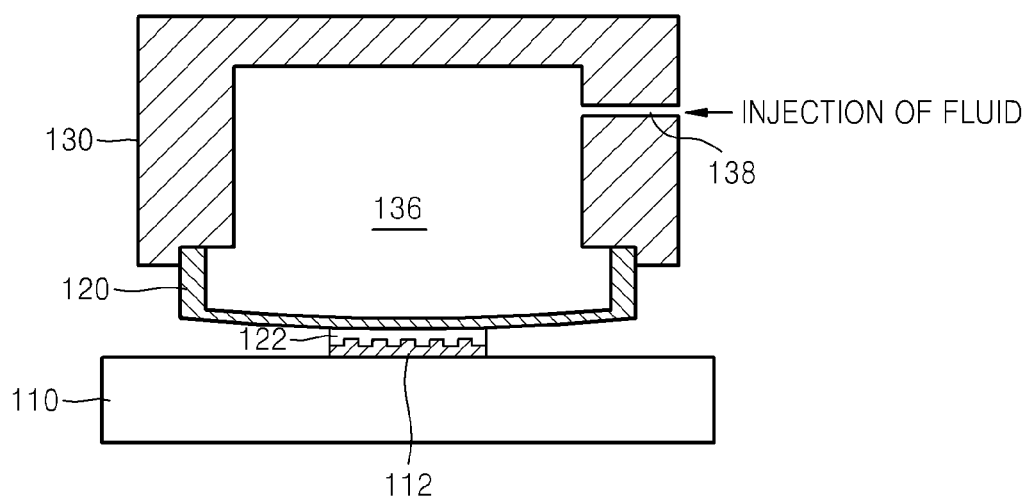

FIG. 4 is a view showing when the template shown in FIG. 1 expands.

Referring to FIG. 4, when using the template 120 according to the present example embodiment, if a medium (e.g., gas or liquid) flows into the cavity 136 during an S-FIL process, internal pressure of the cavity 136 is increased, thereby expanding the first plate 124 toward the substrate 110. As such, if the first plate 124 expands, a conformal contact characteristic between the substrate 110 and the template 120 may be improved, thereby accelerating coating of the resin material 112.

FIG. 5 is a flowchart for describing a process of performing an imprint process while changing pressure according to another example embodiment.

The template used in the process described in FIG. 5 has the nano-pattern having a nano-scaled concave-convex pattern, thereby forming a nano-imprint pattern.

Referring to FIG. 5, a template to which a template chuck is coupled is disposed on the substrate to which the resin material is sprayed (S510). The resin material may be liquid. The resin material may be disposed on the substrate in the form of drops, as shown in FIG. 4. Also, if a medium (e.g., gas or liquid) flows into the cavity via the inlet/outlet, the internal pressure of the cavity increases. The first plate on which the nano-pattern is disposed expands due to an increase in the internal pressure, and thus, the nano-pattern contacts the substrate. Accordingly, the resin material spreads on the substrate due to the pressure of the template, and thus, the resin material fills in the nano-pattern of the template.

When the liquid resin material fills in the nano-pattern of the template, the resin material flows in a direction in which the resin material fills in the nano-pattern. However, because the resin material is highly fluid at a normal temperature, various defects may occur according to the flow of the resin material. For example, bubbles may be captured in the resin material. The bubbles may act as a defect during a nano-imprint lithography (NIL).

Thus, the photographing apparatus photographs an area between the substrate and the template (i.e., an area where the resin material spreads) (S520). The template is formed of a transparent material, and thus, the photographing apparatus may photograph the area between the substrate and the template even when the substrate, the template, and the photographing apparatus are sequentially disposed. The photographing apparatus may also apply a photographing result to the bubble calculating apparatus.

The bubble calculating apparatus extracts a resin image from a captured image and calculates an intensity of bubbles from the resin image (S530). When the template contacts the substrate, bubbles may be captured between the template and the substrate due to a poor contact between the template and the substrate. In the resin image, the bubbles may be represented by a color or with brightness different from that of a resin, and thus, the bubble calculating apparatus may extract bubbles from the resin image and calculate an intensity of the bubbles. The bubble calculating apparatus applies the calculated intensity of the bubbles to the pressure controlling apparatus (S540).

If the intensity of the bubbles is equal to or greater than a reference value, the pressure controlling apparatus maintains or increases pressure of the template (S550). The template system discharges the captured bubbles while maintaining or increasing the pressure of the template. On the other hand, if the intensity of the bubbles is less than the reference value, the pressure controlling apparatus decreases the pressure of the template 120 (S560). The template system decreases the pressure of the template with respect to the substrate when the intensity of the bubbles captured between the template and the substrate 110 by repeatedly performing operations S520 to S560.

Figure 6A:
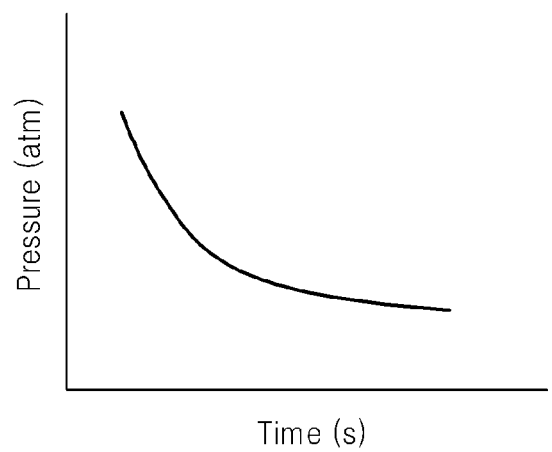
FIGS. 6A to 6C are graphs showing variations in pressure of a template during a conventional nano-imprint process.
Figure 6B:
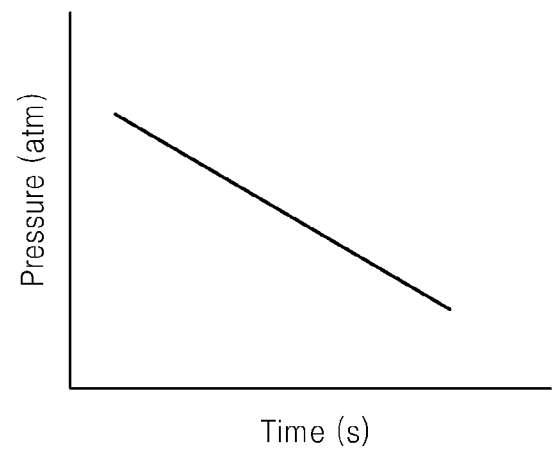
Figure 6C:
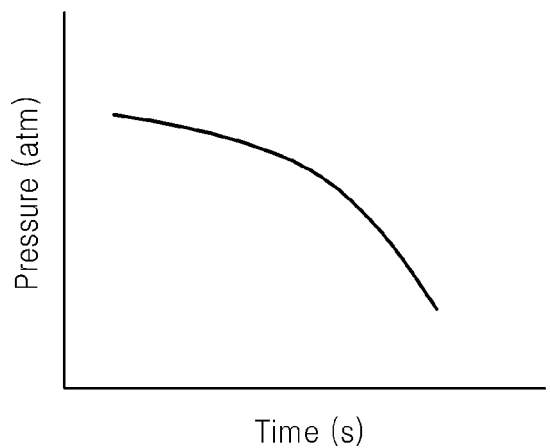
Figure 6D:
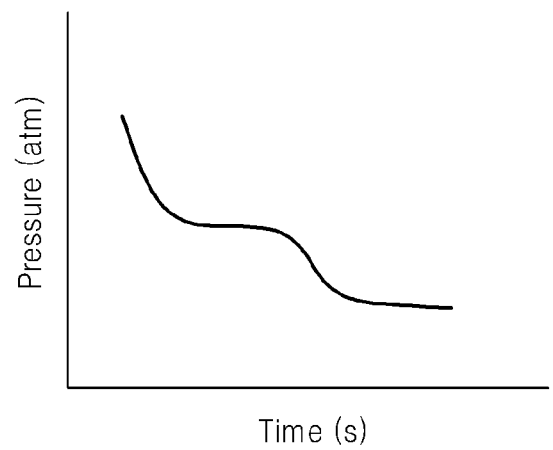
Figure 6E:
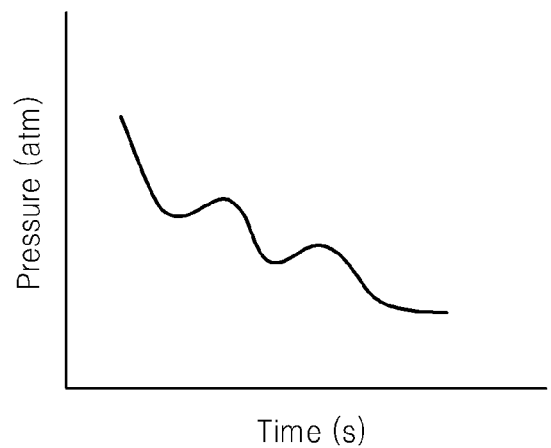

FIGS. 6A to 6C are graphs showing variations in pressure of the template during a conventional nano-imprint process. FIGS. 6D to 6E are graphs showing variations in pressure of the template during a nano-imprint process according to a further example embodiment.

As shown in FIGS. 6A to 6C, in the conventional nano-imprint process, the pressure of the template is sequentially decreased according to time. A degree of the decrease in the pressure of the template may vary under different conditions. Because the pressure of the template is sequentially decreased, the bubbles captured between the template and the substrate maintain their captured state without being discharged to the outside. Accordingly, when the nano-pattern 122 is transferred to a resin layer, the transferring of the nano-pattern 122 may not be properly performed due to the captured bubbles.

However, as shown in FIGS. 6D and 6E, because the nano-imprint process is performed while adaptively changing pressure of the template 120 according to an intensity of the captured bubbles as described above, the intensity of the captured bubbles may be decreased even during the nano-imprint process.

If the template 120 applies pressure to a resin material and then is separated from the resin material, an imprint pattern corresponding to an inverted shape of a shape of the nano-pattern 122 of the template 120 is formed in a resin layer. A set (or, alternatively, predetermined) curing process may be performed before separating the template 120 from the resin material. In other words, the template 120 may be separated from the resin material after performing a curing process on the resin material. In this regard, because the template 120 is completely transparent, the resin material may be cured by irradiating, for example, with UV light. Alternatively, an imprint method using heat may be used to cure the resin material.

According to the template 120 and an imprint method using the template 120, a conformal contact between the substrate 110 and the template 120 is easily performed, and thus, the number of bubbles captured when coating a resin can be reduced to improve a productivity of an imprint process.

A template system according to the example embodiments can decrease an intensity of captured bubbles while changing pressure according to the intensity of the bubbles by analyzing the intensity of the bubbles captured between a substrate and a template.

Accordingly, when performing a nano-imprint process by using the template system, a productivity of the nano-imprint process is improved.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A template system, comprising:
a template having a nano-pattern and configured to transfer the nano-pattern to a resin material on a substrate;
a template chuck supporting the template, the template being coupled to the template chuck to form a cavity;
a photographing apparatus configured to photograph an area between the substrate and the template;
a bubble calculating apparatus configured to sort a resin image including the resin material from an image captured by the photographing apparatus and calculate an intensity of bubbles from the image by dividing the number of bubbles having a size equal to or larger than a reference size by a size of the resin image; and
a pressure controlling apparatus configured to change a pressure of the template with respect to the substrate according to the intensity of the bubbles by adjusting an amount of a medium flowing into the cavity,
wherein the pressure controlling apparatus is configured to maintain or increase the pressure of the template if the intensity of the bubbles is equal to or greater than a reference value and decrease the pressure of the template if the intensity of the bubbles is less than the reference value.

2. The template system of claim 1,
wherein the photographing apparatus, the template chuck, and the template are sequentially stacked over the substrate.

3. The template system of claim 1, wherein a shape of the template varies according to the pressure of the template.

4. The template system of claim 1, wherein a surface of the template facing the substrate expands toward the substrate if the pressure of the template increases.

5. The template system of claim 1, further comprising: the template including a first plate on which the nano-pattern is formed, and a first supporting unit extending from an edge of the first plate, the first supporting unit being coupled to the template chuck.

6. The template system of claim 5, wherein,
the template chuck includes,
a second plate facing the first plate such that a cavity is between the first and second plates, and
a second supporting unit extending from an edge of the second plate, the second supporting unit being coupled to the template.

7. The template system of claim 6, further comprising:
an inlet/outlet connected to the cavity by penetrating an area of the second supporting unit,
the inlet/outlet being configured to allow a medium to flow into/from the cavity.

8. The template system of claim 6, wherein a shape of the first plate varies according to an amount of medium injected into the cavity.

9. A nano-imprint method, comprising:
disposing a template having a nano-pattern on a substrate coated with a resin material, the template being supported by, and coupled to, a template chuck to form a cavity;
photographing an area between the substrate and the template;
sorting a resin image including the resin material from an image of the photographed area;
calculating an intensity of bubbles in the image with a bubble calculating apparatus by dividing the number of bubbles having a size equal to or larger than a reference size by a size of the resin image; and
changing a pressure of the template with respect to the substrate according to the intensity of the bubbles by adjusting an amount of a medium flowing into the cavity with a pressure controlling apparatus configured to maintain or increase the pressure of the template if the intensity of the bubbles is equal to or greater than a reference value and decrease the pressure of the template if the intensity of the bubbles is less than the reference value.

10. The nano-imprint method of claim 9, wherein the changing of the pressure of the template results in change in a shape of the template.

11. The nano-imprint method of claim 9, wherein the changing of pressure of the template includes increasing the pressure of the template such that a surface of the template facing the substrate expands toward the substrate.

* * * * *